United States Patent [19]

Malaviya

[11] 4,439,842
[45] Mar. 27, 1984

[54] BIPOLAR TRANSISTOR READ ONLY OR READ-WRITE STORE WITH LOW IMPEDANCE SENSE AMPLIFIER

[75] Inventor: Sashi D. Malaviya, Fishkill, N.Y.

[73] Assignee: International Business Machines Corp., Armonk, N.Y.

[21] Appl. No.: 290,547

[22] Filed: Aug. 6, 1981

Related U.S. Application Data

[63] Continuation of Ser. No. 107,812, Dec. 28, 1979.

[51] Int. Cl.³ ............................................ G11C 11/40
[52] U.S. Cl. .................................... 365/104; 365/154
[58] Field of Search ................ 365/94, 103, 104, 174, 365/154

[56] References Cited

U.S. PATENT DOCUMENTS

| | | | |
|---|---|---|---|
| 3,618,052 | 11/1971 | Kwei et al. | 365/155 |
| 3,909,805 | 9/1975 | Touron et al. | 365/105 |
| 3,957,008 | 4/1977 | Sheng | 307/362 |
| 4,078,261 | 3/1978 | Millhollan et al. | 307/DIG. 3 |

OTHER PUBLICATIONS

"Beam–Lead Sealed–Junction Semiconductor Memory with Minimal Cell Complexity" by John Iwersen *IEEE Journal of Solid State Circuits*, No. 4, Dec. 1967, pp. 196-201.

Perhs et al., "Bit Line Constant Current Sources Switch for Read Only Store" IBM Tech. Dis. Bul., vol. 20, No. 11a, pp. 4412-4414, 4/78.

*Primary Examiner*—Terrell W. Fears
*Attorney, Agent, or Firm*—W. S. Robertson

[57] ABSTRACT

In a bipolar transistor storage array, the single emitter terminal of each transistor is connected to a bit line. Each bit line is connected to a sense amplifier that provides a low impedance connection to a current source or voltage reference point. The low impedance circuit helps to provide fast switching for a write operation and a noise immune storage operation. The emitter connection and the sense amplifier construction simplify the conversion of the array or part of the array to a read only storage function.

3 Claims, 1 Drawing Figure

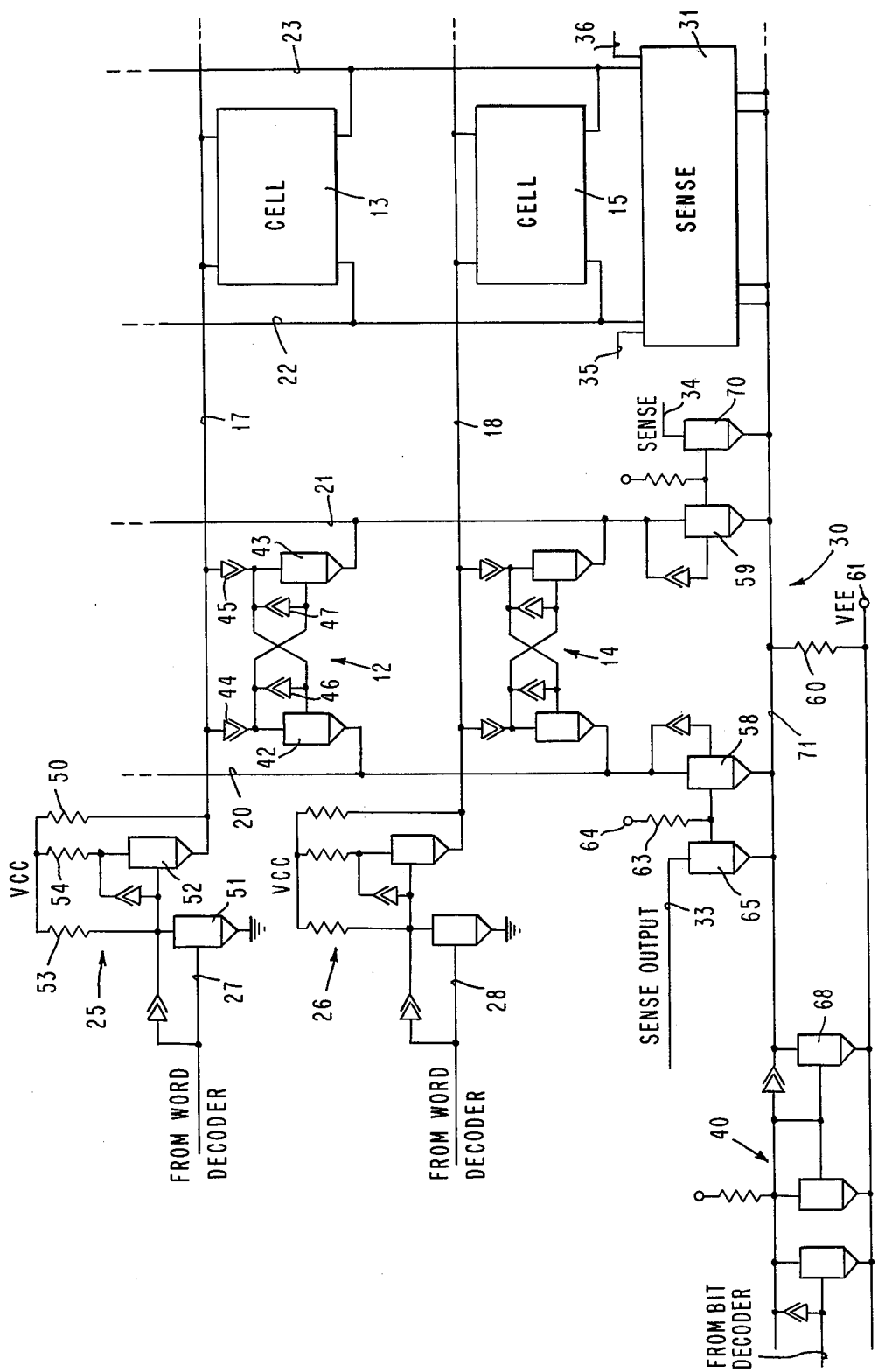

BIPOLAR TRANSISTOR READ ONLY OR READ-WRITE STORE WITH LOW IMPEDANCE SENSE AMPLIFIER

This is a continuation of application Ser. No. 107,812 filed Dec. 28, 1979.

INTRODUCTION

Although data stores using diode or bipolar transistor storage cells are well known, it will be helpful to review some of the features and terminology that particularly apply to this invention. These stores have an orthogonal array of word lines and bit lines. It will be convenient to visualize the word lines in rows and the bit lines in columns. In a read only store, a diode circuit is located at each cross over point of a word line and a bit line, and it is connected between the word and bit lines to represent a binary 1 storage state or it is not connected to represent a binary 0 storage state. When a word line of the array is energized by a word driver circuit, a current flows in the circuit of the selected word wire and in the bit lines where the diode interconnection exists. The current or absence of current in each bit line is sensed to read the storage state of the cells of the selected word. Read only stores are useful where information is generally unchanged, for example, for use as a control store that holds a sequence of microinstructions for executing machine level instructions in an engine of a data processing system.

In a read-write store, each cell may have two bipolar transistors that have their collector and base terminals interconnected to form a bistable circuit. In the data store that will be described more specifically later, there are two bit lines for each column of storage cells and the two 1 and 0 binary storage states are represented by conduction in the collector-emitter circuit of one or the other of the two transistors of a cell between the word line and one of the two bit lines. For a read operation, the voltage or the current on a selected word line is raised to a value to produce an increased current on each bit line that is connected to a conducting transistor. For a write operation, the voltages or currents on the selected word line and on one of the other of each pair of bit lines are changed to permit the addressed storage cells to switch to or maintain a selected storage state.

OBJECTS OF THE INVENTION

One of the objects of this invention is to provide a new and improved bipolar storage array that can be easily modified during manufacture for use either as a read only array or as a read-write array. The read-write array that has been described can be converted to a read only array by deleting the cross connections between the two transistors of a bistable circuit so that the two transistor circuit with two bit lines becomes two independent diode circuits with two separate bit lines.

The read only function can be provided by an array in which an emitter terminal of each bistable transistor is connected to the associated bit line and the base-emitter junction of the transistor forms a diode as in a conventional read only array. In one example of the known prior art, each transistor has two emitter terminals. One emitter terminal is connected to ground to provide conduction when the cell is in a storage state and the other emitter terminal is connected to the bit line to function as an input terminal during a write operation and to provide a bit current for a read operation. One of the objects of this invention is to provide a new and improved data store in which each transistor has a single emitter terminal that is connected to the bit line. One advantage of the single emitter transistor is that the number of manufacturing defects associated with the emitter structure is reduced.

SUMMARY OF THE INVENTION

In the data store of this invention, the two bipolar transistors of each storage cell have a single emitter terminal that is connected to have the potential of the associated bit line. A bit line is connected to a sense amplifier that is arranged to provide a low impedance path between the two emitter terminals of each cell and either a node of a current source or a reference voltage point. This sense amplifier and its interconnection with the storage cells helps to maintain a low emitter voltage and to thereby maintain a maximum collector voltage difference for each cell. In addition, the circuit helps to maintain equal voltages at the two emitter terminals of each cell. Both of these factors help to prevent a cell from unintentionally switching its storage state in response to electrical noise on the bit and word lines.

Other features of the invention will be apparent from the description of a specific embodiment of the invention.

THE DATA STORE OF THE DRAWING

Introduction

Four representative storage cells 12–15 are connected in an array of word lines 17, 18 and paired bit lines 20, 21 and 22, 23. Each word line 17,18 has a word driver 25, 26 that maintains a voltage on the word line that is suitable for read, write, and storage operations. A word driver is selected by means of a signal on a line 27 or 28 from an address decoder circuit (not shown). The two bit lines of each bit position are connected to a sense amplifier 30 or 31 and during a read operation each sense amplifier produces a signal on one of two associated output lines 33 or 34 and 35 or 36 to signify that the storage cell for the corresponding bit position of the selected word stores a 1 or a 0.

The array may also have a bit selection circuit 40 that enables one or more selected sense amplifiers of the array to respond during a read operation. The array also includes bit line drivers (not shown) that produce a signal on one or the other of the two bit lines of each bit position for a write operation.

The Storage Cell

Representative storage cell 12 has two bipolar transistors 42, 43 that are connected through Schottky diodes or other suitable load devices 44, 45 to receive current from word line 17. The base and collector terminals of transistors 42, 43 are interconnected to form a bistable circuit. The storage cell may also include Schottky diodes 46, 47 that are connected to prevent transistors 42, 43 from saturating.

The storage cell as it has been described so far is conventional and the operation of the cell for read and write operations will be readily understandable. For storing data, one transistor 42 or 43 is turned on and the other transistor is turned off. The on transistor conducts in circuit with its associated bit line 20 or 21. For a read operation, the voltage on a word line is raised to change the cell from a low conduction state to a high conduction state and the corresponding increase in the emitter current of one of the transistors is detected as an increase in current in one or the other of the associated bit lines. For a write operation, the voltage on a selected one of the two bit lines is raised and/or the voltage on the other line is lowered to cause the selected transistor of the cell to conduct.

THE WORD DRIVER

In circuit 25, a resistor 50 is connected to a potential point to form a current source at the connection point of the resistor to word line 17. This current source is arranged to provide the current that is required by each cell of the word during the low current storage condition. Collector resistors 53 and 54 and an anti-saturation Schottky diode 55 are connected to supply the higher current to the word line that is required for a read operation. During storage, transistor 52 is off and transistor 51 is maintained on by an up voltage level on line 27. When the signal on line 27 falls, transistor 51 turns off and transistor 52 turns on to apply additional current to the word line through resistor 4. A separate driver, not shown, is used for a write operation.

THE SENSE CIRCUIT

Bit line 20 is connected to the collector terminal of a transistor 58 and bit line 21 is similarly connected to a transistor 59. The emitter terminals of transistors 58, 59 are connected to a current source formed by a resistor 60 and a potential point 61 or by other well known means such as a transistor connected with an emitter resistor and with a reference voltage across the base-emitter circuit of the transistor and the resistor to define a current at the collector terminal of the transistor. A resistor 63 is connected between the base terminal of transistor 58 and a potential point 64 to define a base current for transistor 58 and for a transistor 65. Because the base terminals and emitter terminals of the transistors have the same voltage, their collector currents are essentially identical and a change in the bit line current at the collector of transistor 58 produces a corresponding change in the collector current of transistor 65 and in an output line 33 which is connected to the collector terminal of transistor 65. The circuit of transistors 58–65 is described in my application Ser. No. 934,732 for "An Open Collector Bit Driver/Sense Amplifier" filed Aug. 21, 1978.

THE READ OPERATION

Suppose that word line 17 has been selected and that transistor 42 is on and transistor 43 is off in storage cell 12. The rise in voltage on word line 17 permits a significant additional current to flow in the collector-emitter circuit of transistor 42 and in bit line 20. There is no significant increase in current in bit line 21, since transistor 43 is off in this example. The value of resistor 63 and potential point 64 is chosen to supply an amount of base current to transistor 58 that corresponds to this increased current in the bit line during a read operation. Thus, the change in voltage at the collector terminal of transistor 58 is kept low. Transistor 68 in the bit selection circuit 40 is turned on for this read operation to form a current souce for transistors 58, 65 (or 59, 70).

Consider a circuit consisting only of storage cell 12, node 71, and passive resistors in place of transistors 58 and 59. This simplification of the circuit of the drawing is a well known emitter coupled flip flop. In such a circuit, the flipping action is brought about not only by the base to collector interconnection of the two transistors 42, 43 but also by the emitter coupling. As the on transistor, for example 42, starts to go off, its decrease in current is switch to the emitter terminal of the other transistor 43. Equivalently, the fall in voltage at the emitter terminal of the off going transistor 42 increases the base-emitter voltage of the on coming transistor 43 and thereby helps to turn on transistor 43. Resistors corresponding in this simplified circuit of transistors 58 and 59 are sometimes used to isolate the emitter voltages to compensate for variations in the base-emitter characteristics, but an appreciable value for these resistors would isolate the two emitter terminals and thereby decrease the coupling effect and the faster switching. This effect can also be explained in terms of the negative feedback introduced by such resistances.

Thus, the circuit of this invention permits isolation of the emitter terminals of the storage cell transistors at the bit line connection but it maintains this coupling within the overall array with only a minimum potential difference that is produced by transistors 58 and 59.

THE READ ONLY STORE

One of the advantages of maintaining the emitter terminals isolated within the storage cell is that the array can be used as a read only store by selectively breaking one of the emitter connections to the bit line for each cell. The array can be used advantageously as a read/write array during a phase of developing a suitable data pattern and thereafter the same chip design can be used as a read only store.

Read/write storage cell 12 can be converted to two read only cells by not forming (or by otherwise breaking) the connections to the collector terminals of transistors 42, 43. One read only cell is formed by the series connection of Schottky diode 45 and the diode formed by the base-emitter junction of transistor 42; the other cell is formed by Schottky diode 44 and the base-emitter circuit of transistor 43. This path between word line 17 and a bit line 20 or 21 represents one binary storage state, and the circuit is broken (preferably by not forming the metal anode of a Schottky diode 44 or 45) to represent the other binary value. In the read only array, transistors 58, 65 and associated components form a sense circuit for bit line 20 and transistors 59, 70 and associated components form an independent sense circuit for bit line 21.

Having thus described our invention, what we claim as new and desire to secure by Letters Patent is:

1. A data store of the type having bit lines and word lines and a semiconductor device located at cross over points of a word line and a bit line,
    wherein the semiconductor device comprises a single emitter bipolar transistor and means connecting the emitter terminal of the transistor to the associated bit line,
    and a plurality of current sensing circuits connected to conduct between the bit lines and a common point, said current sensing circuits having a low impedance in the circuit between said emitter terminals, wherein the improvement comprises,
    a first transistor and a second transistor in the current sensing circuit for each bit line each having an emitter terminal connected to a common current source, the current source providing a sufficiently high base current during a read operation to maintain said low impedance in the collector-emitter circuit of the first transistor, whereby the first and second transistors tend to have corresponding collector currents, means connecting the collector terminal of said first transistor to a bit line, and means connecting the collector terminal of said second transistor to signify the data storage state of a cell during a read operation.

2. The data store defined in claim 1 having a read-write section and a read only section, and a semiconductor device located at cross over points of a word line and a bit line, pairs of some of said bipolar transistors being cross connected between their base and collector terminals to form a bistable read-write storage cell, the impedance of said current responsive circuits being sufficiently low to maintain substantially the voltage between a word line and said common point as a collector difference voltage for a cell in a data storage state, others of said semiconductor devices being arranged to function as diodes forming the read only section of the store.

3. A data store of the type having bit lines and word lines and a semiconductor device located at cross over points of a word line and a bit line, wherein the semiconductor device comprises a single emitter bipolar transistor and means connecting the emitter terminal of the tranistor to the associated bit line, and a plurality of current sensing circuits connected to conduct between the bit lines and a common point, said current sensing circuits having a low impedance in the circuit between said emitter terminals, pairs of some of said bipolar transistors being cross connected between their base and collector terminals to form a bistable storage cell, the impedance of said current responsive circuits being sufficiently low to maintain substantially the voltage between a word line and said common point as a collector difference voltage for a cell in a data storage state, others of said some connector devices being arranged to function as diodes forming a read only section of the store, the current sensing circuit comprising a first transistor and a second transistor each having an emitter terminal connected to said common point and having a base terminal connected to a common current source, whereby the first and second transistors tend to have corresponding collector currents, means connecting the collector terminal of said first transistor to a bit line, and means connecting the collector terminal of said second transistor to signify the data storage state of a cell during a read operation, pairs of said bipolar transistors being cross connected between their base and collector terminals to form a bistable storage cell and wherein the impedance of said current responsive circuits is sufficiently low to maintain substantially the voltage between a word line and said common point as a collector difference voltage for a cell in a data storage state, said current source providing a sufficiently high base current during a read operation to maintain said low impedance in the collector-emitter circuit of the first transistor, and means connecting the current source at said common point, the impedance of said current sensing circuits having a low value such that current division between the two bit lines of a bistable storage cell is established substantially by the binary storage stage of the cell and independent of the impedance of the current sensing circuits.

* * * * *